US012163740B2

(12) United States Patent
Graham

(10) Patent No.: US 12,163,740 B2
(45) Date of Patent: Dec. 10, 2024

(54) PHASE CHANGE MATERIAL (PCM) HEATSINKS

(71) Applicant: Simmonds Precision Products, Inc., Vergennes, VT (US)

(72) Inventor: Jason Graham, Prior Lake, MN (US)

(73) Assignee: Simmonds Precision Products, Inc., Vergennes, VT (US)

( * ) Notice: Subject to any disclaimer, the term of this patent is extended or adjusted under 35 U.S.C. 154(b) by 113 days.

(21) Appl. No.: 17/891,778

(22) Filed: Aug. 19, 2022

(65) Prior Publication Data

US 2024/0060723 A1     Feb. 22, 2024

(51) Int. Cl.
*H05K 7/20*     (2006.01)
*F28D 15/02*     (2006.01)
*H05K 1/02*     (2006.01)

(52) U.S. Cl.
CPC ......... *F28D 15/0233* (2013.01); *H05K 1/021* (2013.01); *H05K 7/2029* (2013.01)

(58) Field of Classification Search
CPC .... H01L 23/427; H05K 7/2029; H05K 1/021; F28D 15/0233
See application file for complete search history.

(56) References Cited

U.S. PATENT DOCUMENTS

| 8,671,570 | B2 * | 3/2014 | Liu ....................... H01L 23/427 |
| | | | 29/890.032 |
| 9,036,352 | B2 | 5/2015 | Engelhardt et al. |
| 9,918,407 | B2 | 3/2018 | Rosales et al. |
| 2006/0238984 | A1 * | 10/2006 | Belady .................... H01L 23/42 |
| | | | 257/E23.098 |
| 2009/0141456 | A1 * | 6/2009 | Juett .................... H05K 3/4641 |
| | | | 361/721 |

FOREIGN PATENT DOCUMENTS

CN     111988951     * 11/2020    ......... H05K 7/20336

OTHER PUBLICATIONS

English translation of CN 111988951 (Year: 2020).*

* cited by examiner

*Primary Examiner* — Mukundbhai G Patel
(74) *Attorney, Agent, or Firm* — Schwegman Lundberg & Woessner, P.A.

(57) ABSTRACT

A heatsink system includes a heatsink plate having a first set of slots defined in a first face thereof and a second set of slots defined in a second face thereof opposite the first face. The first and second sets of slots are configured to house phase change material (PCM) therein.

14 Claims, 7 Drawing Sheets

PHASE CHANGE MATERIAL (PCM) HEATSINKS

BACKGROUND

1. Field

The present disclosure relates to heatsinks such as for temperature sensitive electronic devices, and more particularly to heatsinks utilizing phase change materials (PCMs).

2. Description of Related Art

Long range precision guided munitions are requiring an ever-increasing amount of launch acceleration to reach their targets at extended ranges. Those high accelerations apply large forces on guidance electronics and hardware. The munition also requires small SWAP-C (size, weight, power, and cost) subsystems due to an increasing demand for small aerodynamic profiled airframe bodies, to maintain the speed necessary to traverse the range. This leads to higher density electronics. With these high acceleration loads, board bending is an increased risk. With higher density electronics, there is an increasing need for cooling capability.

The conventional techniques have been considered satisfactory for their intended purpose. However, there is an ever present need for improved systems and methods for improved cooling in electronic components such as used in guided munitions. This disclosure provides a solution for this need.

SUMMARY

A heatsink system includes a heatsink plate having a first set of slots defined in a first face thereof and a second set of slots defined in a second face thereof opposite the first face. The first and second sets of slots are configured to house phase change material (PCM) therein.

The heatsink plate can have a thickness t1 defined from the first face to the second face. The first set of slots can extend into the first face to a depth d1. The second set of slots can extend into the second face to a depth d2, wherein $d1+d2 \geq t1$. It is also contemplated that d1, d2, and t1 can confirm to the inequalities: $d1 > 0.5 \cdot t1$, and $d2 > 0.5 \cdot t1$.

The first set of slots can include a first array of optionally evenly spaced slots, each extending in a first direction. The second set of slots can include a second array of optionally evenly spaced slots, each extending in a second direction that is optionally perpendicular to the first direction. Interstices of the first and second arrays of evenly spaced slots can include passages through from the first face to the second face of the heatsink plate. The passages can be configured for passage of PCM material therethrough.

A peripheral rim extending around the heatsink plate can stand proud of the first face and can stand proud of the second face. A cover can be seated inside the rim against the first face for housing PCM in the heatsink plate. The cover can be thermally conductive, and a printed circuit board (PCB) with a heat generating component mounted thereto, can be included. The PCB can be in thermal communication with the first cover for conduction of heat generated by the heat generating component though the cover and into the PCM for heatsinking. It is also contemplated that the cover can be thermally insulative, wherein the cover thermally insulates the heat sensitive component from heat in the PCM and heatsink plate. The PCB can be mounted to the cover with the electronic component on a side of the PCB opposite from the cover. It is also contemplated that PCB can be mounted to the cover with the electronic component on the same side of the PCB as the cover.

A second cover can be seated inside the rim against the second face for housing PCM in the heatsink plate between the first and second covers. A second PCB can be included with a second electronic component mounted thereto. The second PCB can be mounted to the second cover with the second electronic component on a side of the second PCB opposite from the second cover. It is also contemplated that the second PCB can be mounted to the second cover with the second electronic component on the same side of the second PCB as the second cover. A potting material can encase the heatsink plate, the PCM, the first cover, the second cover, the first PCB, the first electronic component, the second PCB, and the second electronic component.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
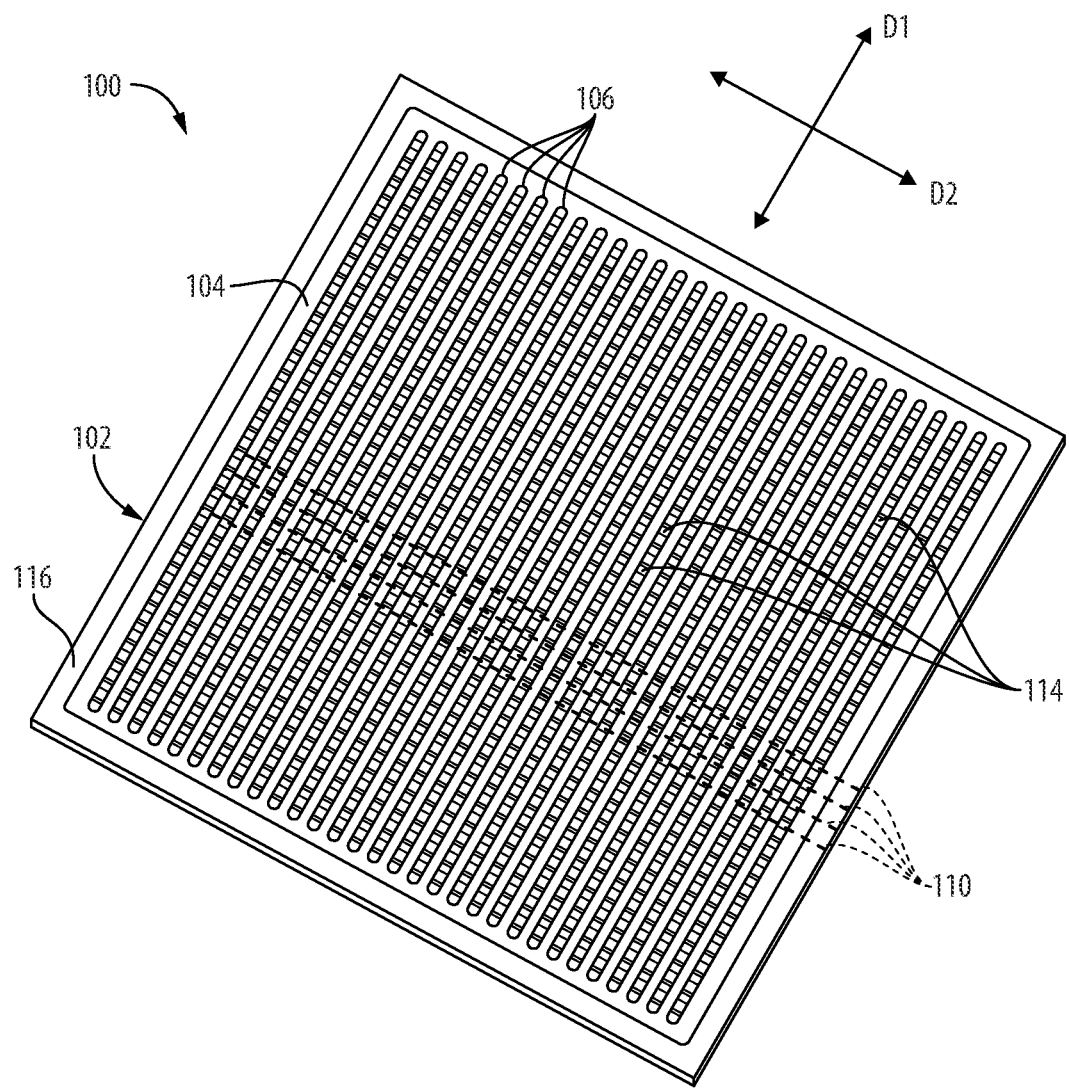
FIG. 1 is a schematic perspective view of a portion of an embodiment of a heatsink system constructed in accordance with the present disclosure, showing the heatsink plate with slots for phase change material (PCM)

Reference will now be made to the drawings wherein like reference numerals identify similar structural features or aspects of the subject disclosure. For purposes of explanation and illustration, and not limitation, a partial view of an embodiment of a heatsink system in accordance with the disclosure is shown in FIG. 1 and is designated generally by reference character 100. Other embodiments of systems in accordance with the disclosure, or aspects thereof, are provided in FIGS. 2-7, as will be described. The systems and methods described herein can be used to provide heatsinking for heat generating electronic components.

Figure 2:
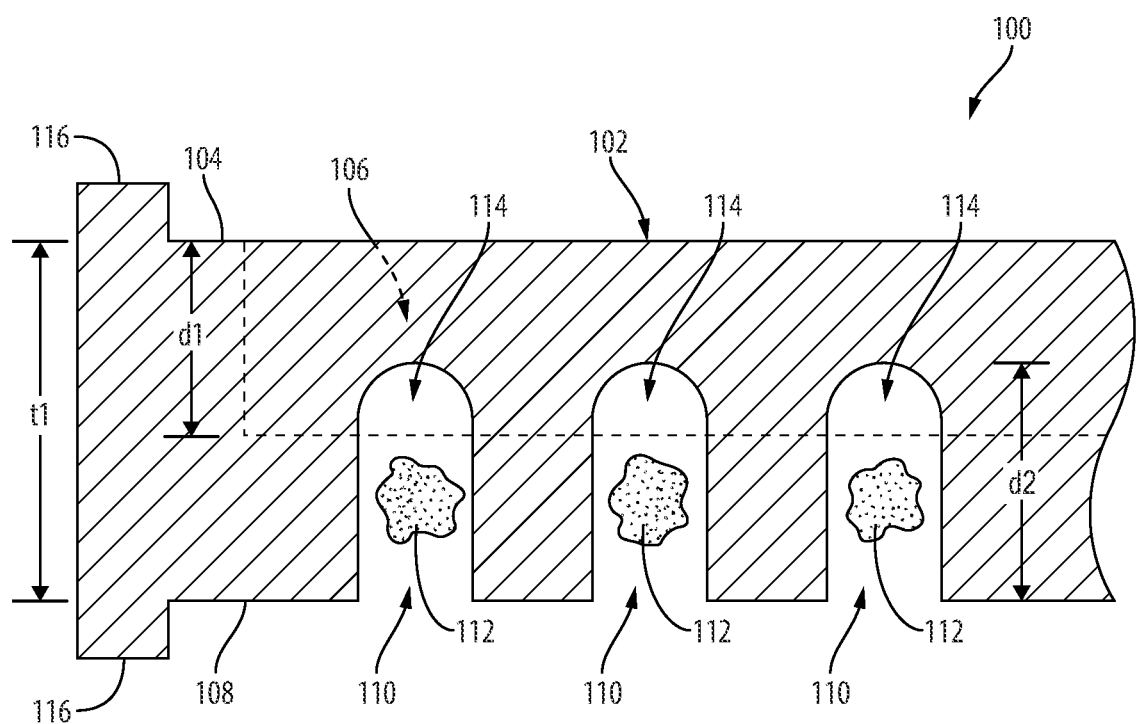
FIG. 2 is a schematic cross-sectional side elevation view of the heatsink plate of FIG. 1, showing the relative depths of the slots in the first and second faces.

The heatsink system 100 includes a heatsink plate 102 having a first set of slots 106 defined in a first face 104 thereof and a second set of slots 110 defined in a second face 108 thereof opposite the first face 104 (the face 108 is labeled in FIG. 2). The first and second sets of slots 106, 110 are configured to house phase change material (PCM) 112 therein, a small schematic representation of the PCM is labeled in FIG. 2. As shown in FIG. 1, the first set of slots 106 includes a first array of evenly spaced slots 106, each extending in a first direction D1. The second set of slots 110 includes a second array of evenly spaced slots 110, each extending in a second direction D2 that is perpendicular to the first direction D1. Those skilled in the art will readily appreciate that the slots 106, 110 are optionally evenly spaced, and that they D1 is optionally perpendicular to D2, and that other slot configurations can be used without departing from the scope of this disclosure.

With reference now to FIG. 2, the heatsink plate 102 has a thickness t1 defined from the first face 104 to the second face 108. The first set of slots 106 extend into the first face 104 to a depth d1. The second set of slots 110 extend into the second face 108 to a depth d2, wherein the sum of the depths d1 and d2 of the slots 106, 110 is greater than the thickness t1 between the two faces 104, 108, or in otherwords: $d1+d2 \geq t1$. One way of reaching this configuration is for each of the depths d1 and d2 to be over 50% of the thickness t1, or in other words: $d1>0.5 \cdot t1$, and $d2>0.5 \cdot t1$. Interstices of the first and second arrays of slots 106, 110 include passages 114 through from the first face 104 to the second face 108 of the heatsink plate 102. The passages 114 are configured for passage of PCM material therethrough. A peripheral rim 116 around the heatsink plate 102 stands proud of the first face 104, i.e. stands higher than the face 104 as oriented in FIG. 2, and stands proud of the second face 116, i.e. stands lower than the face 108 as oriented in FIG. 2.

Figure 3:
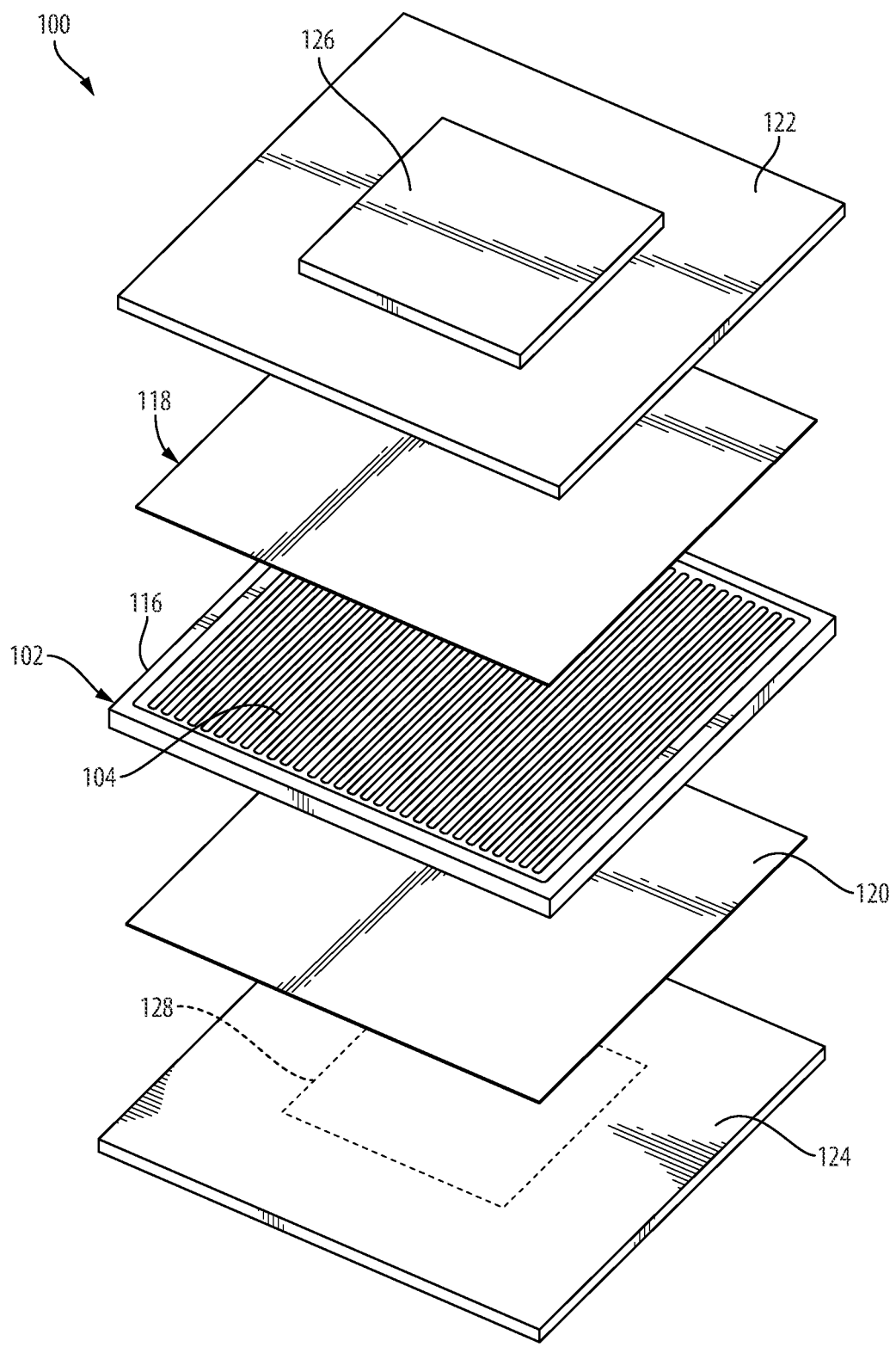
FIG. 3 is a schematic exploded perspective view of the heat sink of FIG. 1 together with covers and printed circuit boards (PCBs) for assembly into the system.
Figure 4:
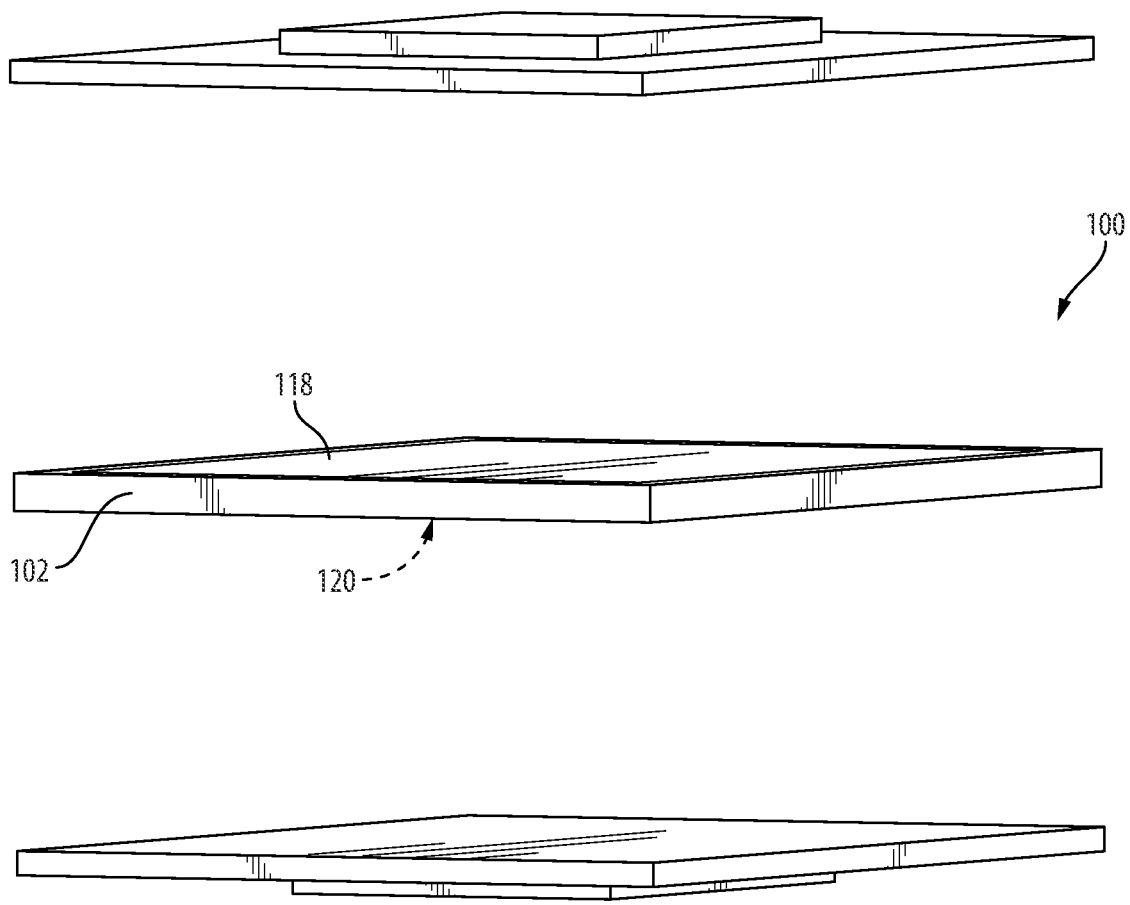
FIG. 4 is a schematic exploded perspective view of the heat sink system of FIG. 3, showing the covers mounted to the heatsink plate to enclose the PCM.

With reference now to FIG. 3, a first cover 118 is seated inside the rim 116 against the first face 104 for housing PCM in the heatsink plate 102. A second cover 120 is seated inside the rim 116 against the second face 108 (which is identified in FIG. 2) for housing PCM in the heatsink plate 102 between the first and second covers 118, 120. FIG. 3 shows the covers 118, 120 exploded away from the heatsink plate 102, and FIG. 4 shows the assembled heatsink plate 102 and covers 118, 120. Any suitable shim or foil can be used for the covers 118, 120. The covers 118, 120 can be thermally conductive, or thermally insulated as needed for a given application.

Figure 5:
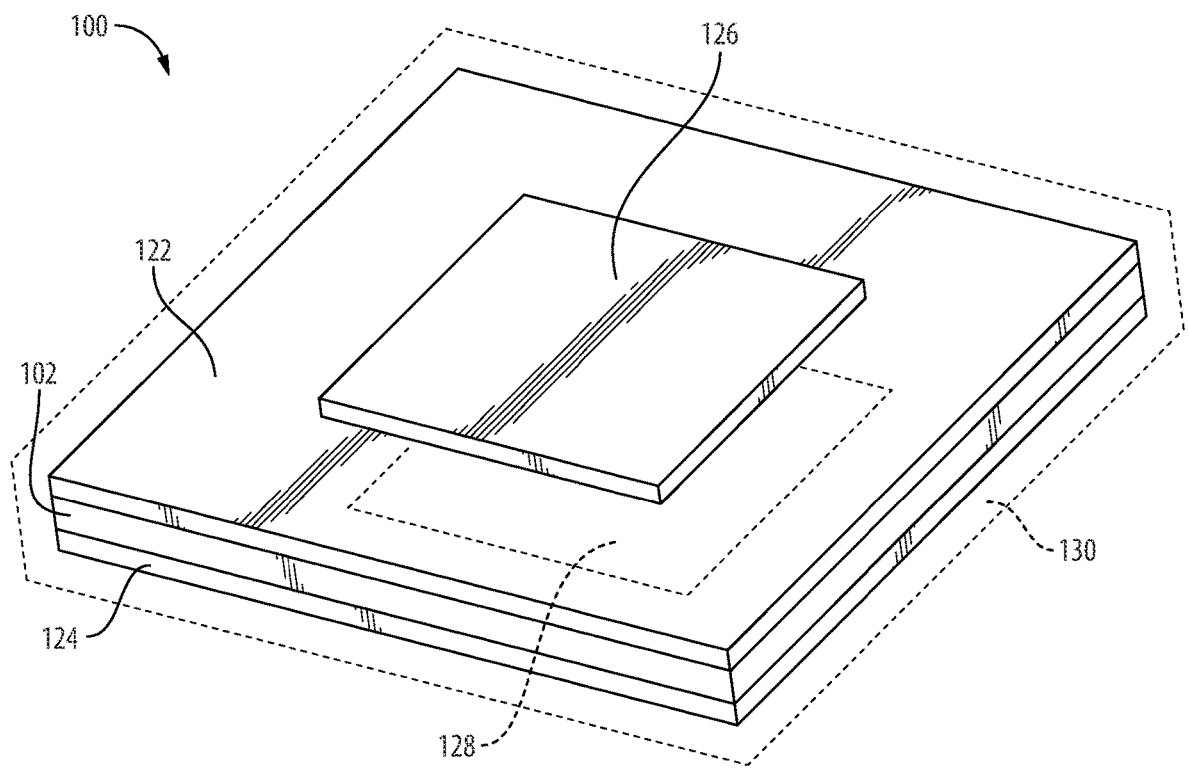
FIG. 5 is a schematic perspective view of the heat sink system of FIG. 4, showing the PCBs mounted to the covers.

With reference again to FIGS. 3-4, and a first printed circuit board (PCB) 122 can be assembled onto the first cover 118, and a second PCB 124 can be assembled onto the second cover 120. Each of the PCBs 122, 124 can include one or more respective electronic components 126, 128 mounted thereto. FIG. 5 shows the PCBs 122, 124 assembled onto the heatsink plate 102. As shown schematically in FIG. 5, a potting material 130 can optionally encase the heatsink plate 102, the PCM 112 (identified in FIG. 2), the first cover 118 (labeled in FIGS. 3-4), the second cover 120 (labeled in FIGS. 3-4), the first PCB 122, the first electronic component 126, the second PCB 124, and the second electronic component 128.

Figure 6:
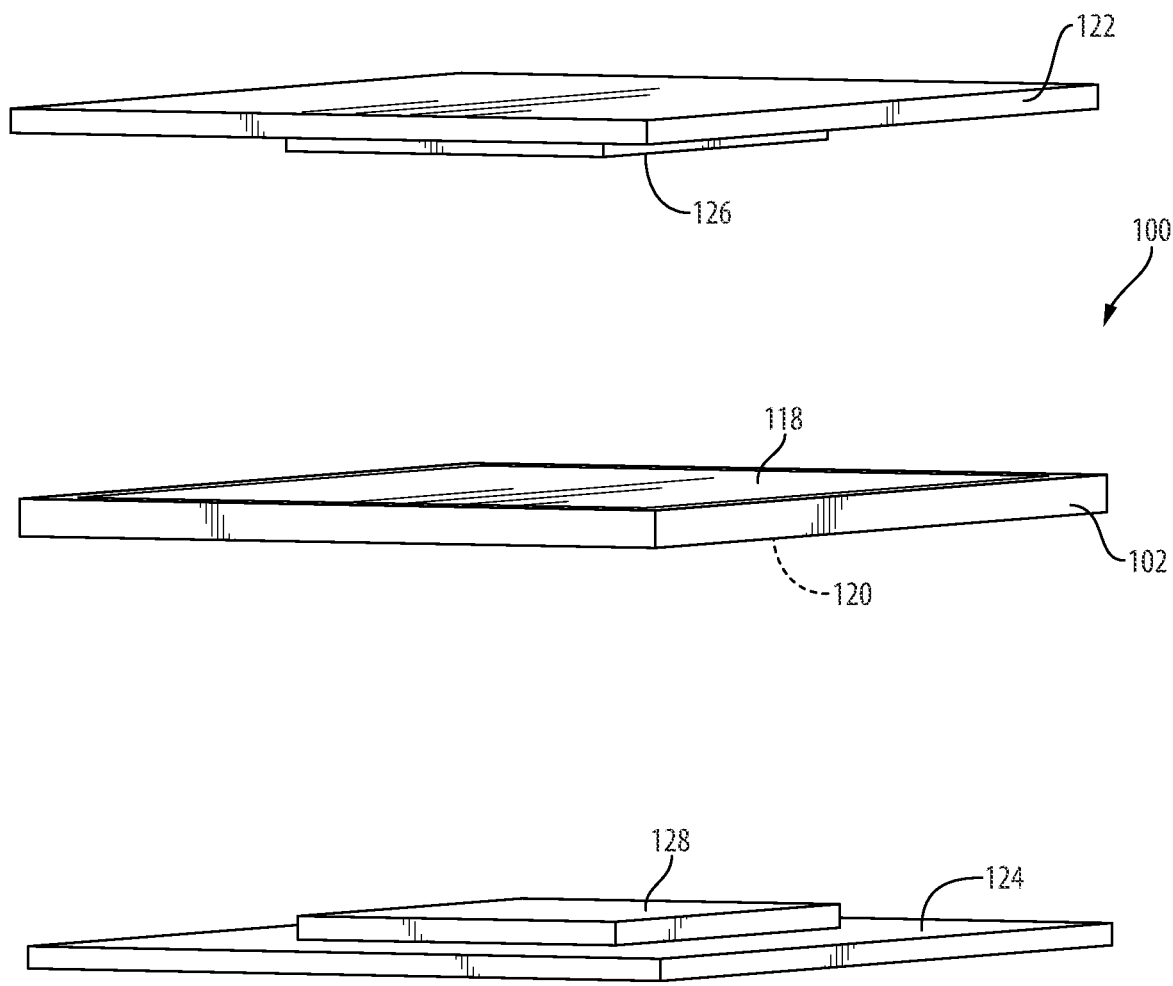
FIG. 6 is a schematic exploded perspective view of the heat sink system of FIG. 4, but with the heat generating components of the PCBs facing inward toward the respective covers.
Figure 7:
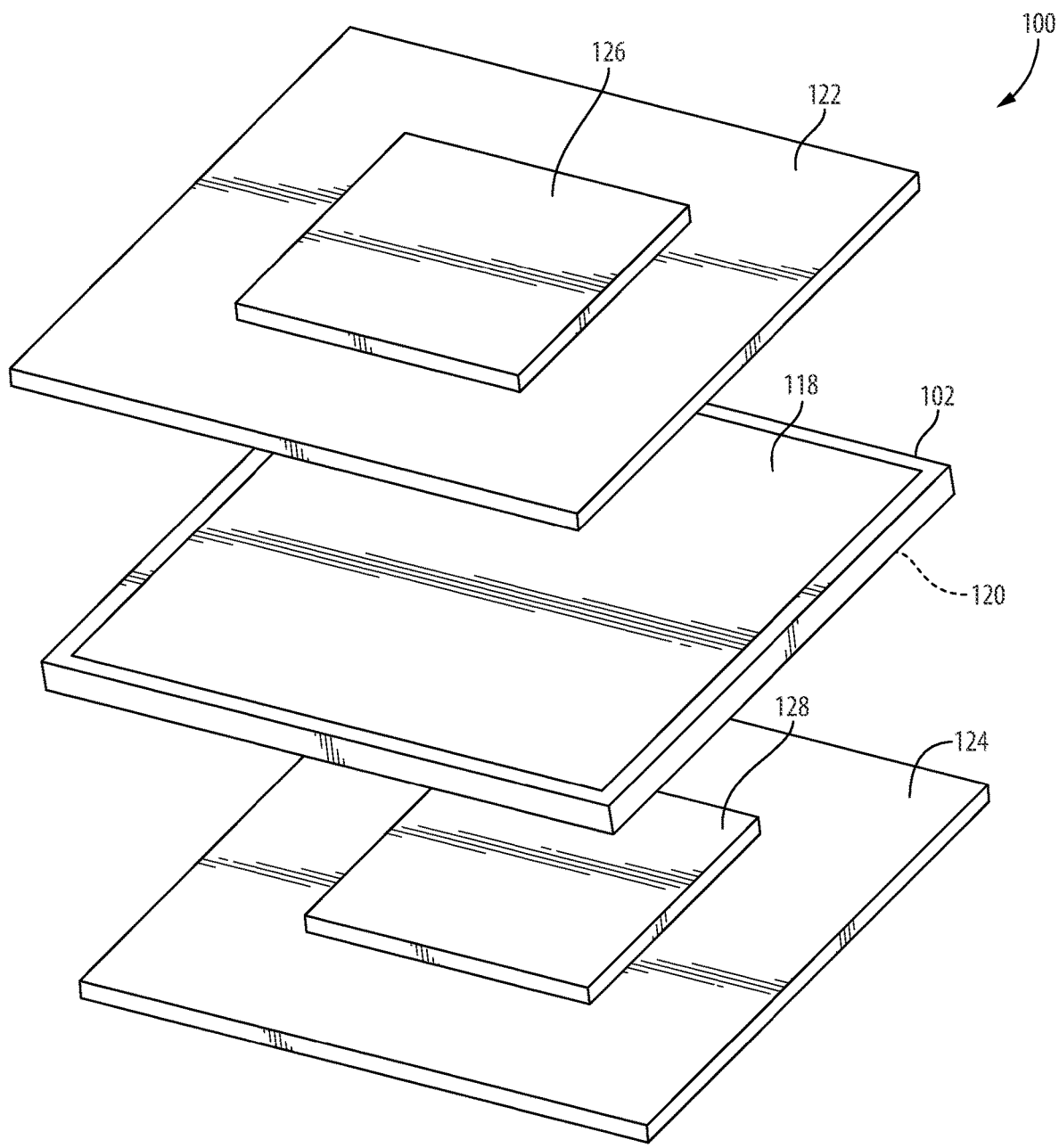
FIG. 7 is a schematic exploded perspective view of the heat sink system of FIG. 4, but with the heat generating components facing with one inward and one outward.

The electronic components 126, 128 can be heat generating components. Each PCB 122, 124 can be in thermal communication with the respective cover 118, 120 for conduction of heat generated by the heat generating component 126, 128 though the respective cover 118, 120 and into the PCM 112 (labeled in FIG. 2) for heatsinking. It is also contemplated that either of the covers can instead be thermally insulative, e.g. in case one or more of the electronic components 126, 128 are heat sensitive components such as sensors, for thermal isolation of the heat sensitive components heat in the PCM 112 (the PCM 112 is labeled in FIG. 2) and heat in the heatsink plate 102. The PCBs 122, 124 in FIGS. 3-5 are mounted to their respective covers 118, 120 with the electronic components on a side of the PCBs 122, 124 opposite from the respective covers 118, 128, i.e. the components 126, 128 are facing outward from the rest of the stacked components of the assembly 100. It is also contemplated, as shown in FIG. 6, that the PCBs 122, 124 can be mounted to their respective covers 118, 120 with the electronic component 126, 128 on the same side of the PCBs 122, 124 as the respective cover 118, 120, i.e. the components 126, 128 are facing inward toward the rest of the stacked components of the assembly 100. It is further contemplated that one PCB 122 can be mounted with its electronic component 126 facing outward, and one PCB 124 can be mounted with its electronic component facing inward, relative to the heatsink plate 102. It is further contemplated that one PCB 122 can be mounted with its electronic component 126 facing outward, and one PCB 124 can be mounted with its electronic component facing inward, relative to the heatsink plate 102, for example as shown in FIG. 7.

Heatsinking as disclosed herein provides potential advantages over conventional techniques, such as the enhanced ability to absorb heat from heat generating components, and to help isolate heat sensitive components from heat generating components as needed. It is contemplated that the PCM can be configure for one time uses, e.g. as in guided munition electronics, or for repeated use applications.

The methods and systems of the present disclosure, as described above and shown in the drawings, provide for heatsinking for heat generating electronic components. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A heatsink system comprising:
   a heatsink plate having a first set of slots defined in a first face thereof and a second set of slots defined in a second face thereof opposite the first face, wherein the first set of slots and second set of slots are configured to house phase change material (PCM) therein, wherein:
   the heatsink plate has a thickness t1 defined from the first face to the second face;
   the first set of slots extend into the first face to a depth d1; and
   the second set of slots extend into the second face to a depth d2 where $d1+d2 \geq t1$.

2. The heatsink system as recited in claim 1, wherein $d1>0.5 \; t1$, and wherein $d2>0.5 \; t1$.

3. The heatsink system as recited in claim 1, wherein the first set of slots includes a first array of evenly spaced slots, each extending in a first direction.

4. The heatsink system as recited in claim 3, wherein the second set of slots includes a second array of evenly spaced slots, each extending in a second direction that is perpendicular to the first direction.

5. The heatsink system as recited in claim 4, wherein interstices of the first array of evenly spaced slots and the second array of evenly spaced slots include passages through from the first face to the second face of the heatsink plate, wherein the passages are configured for passage of PCM material therethrough.

6. The heatsink system as recited in claim 1, wherein a peripheral rim around the heatsink plate stands proud of the first face and stands proud of the second face.

7. The heatsink system as recited in claim 6, wherein a cover is seated inside the peripheral rim against the first face for housing PCM in the heatsink plate.

8. The heatsink system as recited in claim 7, wherein the cover is thermally conductive, and further comprising:
a printed circuit board (PCB) with a heat generating component mounted thereto, wherein the PCB is in thermal communication with the cover for conduction of heat generated by the heat generating component through the cover and into the PCM for heatsinking.

9. The heatsink system as recited in claim 7, wherein the cover is thermally insulative, and further comprising:
a printed circuit board (PCB) with a heat sensitive component mounted thereto, wherein the PCB is mounted to the cover, wherein the cover thermally insulates the heat sensitive component from heat in the PCM and the heatsink plate.

10. The heatsink system as recited in claim 7, further comprising:
a printed circuit board (PCB) with an electronic component mounted thereto, wherein the PCB is mounted to the cover with the electronic component on a side of the PCB opposite from the cover.

11. The heatsink as recited in claim 10, wherein the cover is a first cover, wherein the PCB is a first PCB, wherein the electronic component is a first electronic component and further comprising:
a second cover seated inside the peripheral rim against the second face for housing PCM in the heatsink plate between the first cover and the second cover; and
a second PCB with a second electronic component mounted thereto, wherein the second PCB is mounted to the second cover with the second electronic component on a side of the second PCB opposite from the second cover.

12. The heatsink system as recited in claim 7, further comprising:
a printed circuit board (PCB) with an electronic component mounted thereto, wherein the PCB is mounted to the cover with the electronic component on a same side of the PCB as the cover.

13. A heatsink system comprising:
a heatsink plate including:
a first set of slots defined in a first face thereof and a second set of slots defined in a second face thereof opposite the first face, wherein the first set of slots and the second set of slots are configured to house phase change material (PCM) therein;
a peripheral rim around the heatsink plate standing proud of the first face and standing proud of the second face;
a first cover seated inside the peripheral rim against the first face for housing the PCM in the heatsink plate;
a first printed circuit board (PCB) with a first electronic component mounted thereto, wherein the first PCB is mounted to the first cover with the first electronic component on a same side of the first PCB as the first cover;
a second cover seated inside the peripheral rim against the second face for housing the PCM in the heatsink plate between the first cover and the second cover; and
a second PCB with a second electronic component mounted thereto, wherein the second PCB is mounted to the second cover with the second electronic component on a same side of the second PCB as the second cover.

14. A heatsink system comprising:
a heatsink plate including:
a first set of slots defined in a first face thereof and a second set of slots defined in a second face thereof opposite the first face, wherein the first set of slots and the second set of slots are configured to house phase change material (PCM) therein;
a peripheral rim around the heatsink plate standing proud of the first face and standing proud of the second face;
a first cover seated inside the peripheral rim against the first face for housing the PCM in the heatsink plate;
a first printed circuit board (PCB) with a first electronic component mounted thereto, wherein the first PCB is mounted to the first cover;
a second cover seated inside the peripheral rim against the second face for housing PCM in the heatsink plate between the first cover and the second cover;
a second PCB with a second electronic component mounted thereto, wherein the second PCB is mounted to the second cover; and
a potting material encasing the heatsink plate, the PCM, the first cover, the second cover, the first PCB, the first electronic component, the second PCB, and the second electronic component.

* * * * *